US 6,818,474 B2
(12) United States Patent
Kim et al.

(10) Patent No.: US 6,818,474 B2
(45) Date of Patent: Nov. 16, 2004

(54) METHOD FOR MANUFACTURING STACKED CHIP PACKAGE

(75) Inventors: Ji Yon Kim, Kyoungki-do (KR); Ki Ill Moon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/316,647

(22) Filed: Dec. 11, 2002

(65) Prior Publication Data

US 2003/0124766 A1 Jul. 3, 2003

(30) Foreign Application Priority Data

Dec. 29, 2001 (KR) ................................ 10-2001-0088327

(51) Int. Cl.[7] ........................... H01L 21/44; H01L 23/02
(52) U.S. Cl. ..................... 438/108; 438/109; 257/868; 257/777; 257/786
(58) Field of Search ................................ 257/685, 686, 257/777, 786; 438/109

(56) References Cited

U.S. PATENT DOCUMENTS

| 6,177,721 | B1 | | 1/2001 | Suh et al. ................... 257/686 |
| 6,271,056 | B1 | * | 8/2001 | Farnworth et al. .......... 438/106 |
| 6,322,903 | B1 | | 11/2001 | Siniaguine et al. ......... 428/617 |
| 6,344,401 | B1 | | 2/2002 | Lam ........................... 438/460 |
| 6,348,363 | B1 | | 2/2002 | Chung et al. ............... 438/106 |
| 6,376,904 | B1 | * | 4/2002 | Haba et al. ................. 257/686 |
| 6,423,580 | B2 | | 7/2002 | Moon ........................... 438/123 |
| 6,451,626 | B1 | | 9/2002 | Lin ............................. 438/208 |
| 6,455,928 | B2 | * | 9/2002 | Corisis et al. .............. 257/686 |
| 6,507,098 | B1 | * | 1/2003 | Lo et al. .................... 257/686 |
| 6,515,355 | B1 | * | 2/2003 | Yin et al. ................... 257/678 |
| 2002/0043709 | A1 | * | 4/2002 | Yeh et al. ................... 257/686 |
| 2002/0190396 | A1 | * | 12/2002 | Brand ......................... 257/787 |
| 2003/0134451 | A1 | * | 7/2003 | Chen .......................... 438/109 |
| 2003/0205801 | A1 | * | 11/2003 | Baik et al. ................. 257/686 |

* cited by examiner

Primary Examiner—Mary Wilczewski
Assistant Examiner—Toniae M. Thomas
(74) Attorney, Agent, or Firm—Ladas & Parry LLP

(57) ABSTRACT

The present invention relates to manufacture of a stacked chip package. A first substrate including a first center window is attached to a first semiconductor chip having a plurality of bonding pads arranged on the center part. A first bonding wire is formed to connect the first semiconductor chip and the first substrate. A second substrate including a second center window is attached to a second semiconductor chip having a plurality of bonding pads arranged on the center part. A second bonding wire is formed to connect the second semiconductor chip end the second substrate. The backsides of the resulting first and the second semiconductor chips are attached. A third bonding wire is formed to connect the first and the second substrates. A molding body is formed to overlay the first, the second and the third bonding wires. A conductive ball is adhered to the first substrate.

5 Claims, 5 Drawing Sheets

METHOD FOR MANUFACTURING STACKED CHIP PACKAGE

BACKGROUND OF THE INVENTION

1. Field of the Invention

The present invention relates to a method for manufacturing a semiconductor package, and more particularly, to a method for manufacturing a stacked chip package having a stacked structure comprising a plurality of semiconductor chips.

2. Description of the Related Art

Recently, electronic apparatuses have a small size and a simple structure and therefore, it is required to develop a package having high density and high mount rate. And, according to increased memory capacity, a chip size is increased such as Random Access Memory (RAM) and Flash Memory, however, a package size becomes small.

There are several methods proposed to reduce a package size, including a Multi Chip Package (MCP) and Multi Chip Module (MCM) comprising a plurality of chips and packages. However, the above methods have limitations in production since semiconductor chips and packages are arranged on a substrate in a plane mode.

In order to overcome the limitations, a staked chip package has been proposed, which is formed by stacking a plurality of chips having the same memory capacity.

The stacked chip package has several advantages including low manufacturing cost due to simplified process and mass production, and at the same time disadvantages of small area for inner lead due to increased chip size.

FIG. 1 is a cross sectional view showing a conventional method for manufacturing a stacked chip package.

As shown in FIG. 1, the conventional stacked chip package 100 has a structure that a plurality of semiconductor chips 120,130 and 140 are mounted on a substrate 110 in a plane mode.

The semiconductor chips 120,130 and 140 are attached on the mounting region of the substrate 110 by an adhesive 114 and a plurality of bonding pads 122,132 and 142 are formed on a backside to the side attached to the substrate 110. The semiconductor chips 120,130 and 140 are arranged in a step shape and the bonding pads 122,132 and 142 are formed on the edge of the semiconductor chips 120,130 and 140.

And, bonding wires 124,134 and 144 are formed to electrically connect the bonding pads 122,132 and 142 and a conductive pattern 112.

In order to protect connecting parts on the semiconductor chips 120,130 and 140 and the substrate 110, epoxy resin is sealed, thereby completing a package body 150.

The conductive pattern 112 of substrate 110 is an interconnection layer for the electrical connection of the semiconductor chips 120,130 and 140 and a solder ball 160.

The semiconductor chips 120,130 and 140 are electrically connected with each other by a circuit pattern formed on the substrate 110 or bonding pads 122,132 and 142 are bonded to boding wires 124,134 and 144 by the conductive pattern 112 to accomplish electrical connection.

However, the stacked chips have different size and they are stacked only in a face-up direction on the edge by bonding pads, thereby it is difficult to be applied to chips having the same size and bonding pads arranged on the center of semiconductor chip.

And, it is impossible to increase the number of stacked chip leads in the conventional method. As a result, there is a problem that a NC pin is additionally required since Chip Select Pins (CS pin) of top chips and bottom chips are slit, one of which is connected to CS pin and the other to NC pin.

SUMMARY OF THE INVENTION

Accordingly, the present invention has been made in an effort to solve the problems occurring in the related art, and an object of the present invention is to provide a method for manufacturing a stacked chip package having a bonding pad on the center part and stacking the same size semiconductor chips in both a face up and a face down modes.

In order to achieve the second object, the present invention comprises the steps of: attaching a first substrate including a first center window on a first semiconductor chip having a plurality of bonding pads arranged on the center part; forming a first bonding wire connecting the first semiconductor chip and the first substrate; attaching a second substrate including a second center window on a second semiconductor chip having a plurality of second bonding pads on the center part; forming a second bonding wires connecting the second semiconductor chip and the second substrate; attaching the backsides of the resulting first and the second semiconductor chips; forming a third bonding wire connecting the first and the second substrates; forming a molding body overlaying the first, the second and the third bonding wires; and adhering a conductive ball to the first substrate.

The present method further comprises the steps of forming a first and a second bars for fixing the position on the backsides of the, first and the second substrates to the side where the first and the second center windows are formed.

The first and the second bars for fixing the position are formed of solder resist.

The first and the second bars for fixing the position have a thickness of 20 $\mu$m to 1 mm.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
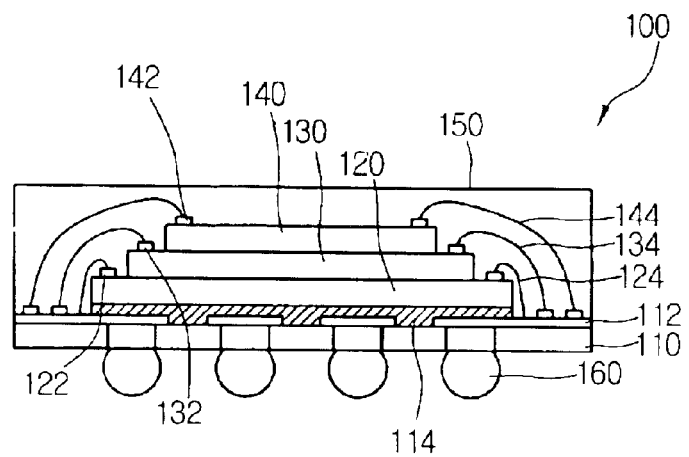
FIG. 1 is a cross sectional view showing a conventional method for manufacturing a stacked chip package.

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 2A to 2F are drawings showing a method for manufacturing a stacked chip package according to an embodiment of the present invention.

Figure 2A:
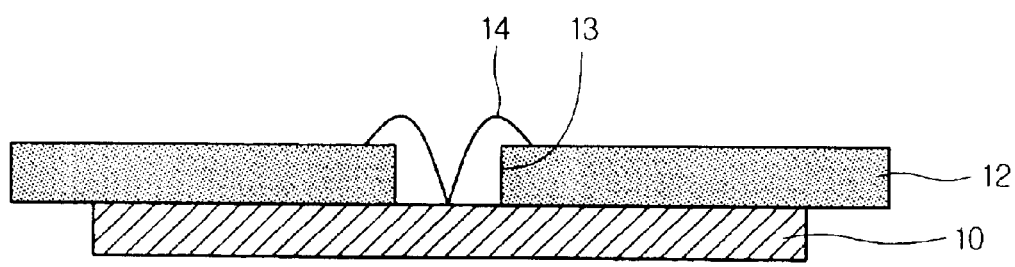
FIGS. 2A to 2F are drawings showing a method for manufacturing a stacked chip package according to an embodiment of the present invention.

Referring to FIG. 2A, a first substrate 12 including a center window 13 is attached on a first semiconductor chip 10 having a plurality of first bonding pads (not shown) on the center part. Then, the first bonding pad and the first substrate 12 are connected by a first bonding wire 14.

Figure 2B:
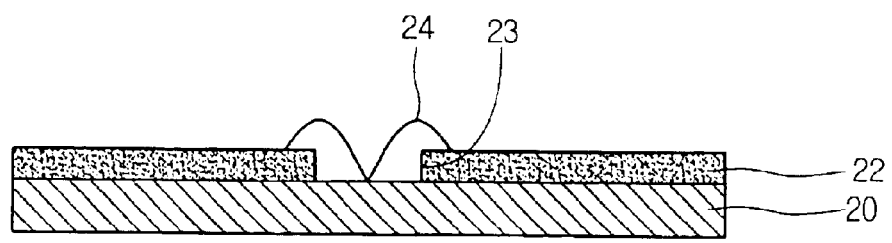

Referring to FIG. 2B, a second substrate 22 including a second center window 23 is attached on a second semiconductor chip 20 having a plurality of second bonding pads (not shown) on the center part. Afterwards, the second bonding pad and the second substrate 22 are connected by a second bonding wire 24. The first and the second semiconductor chips 10 and 20 have the same size.

Figure 2C:
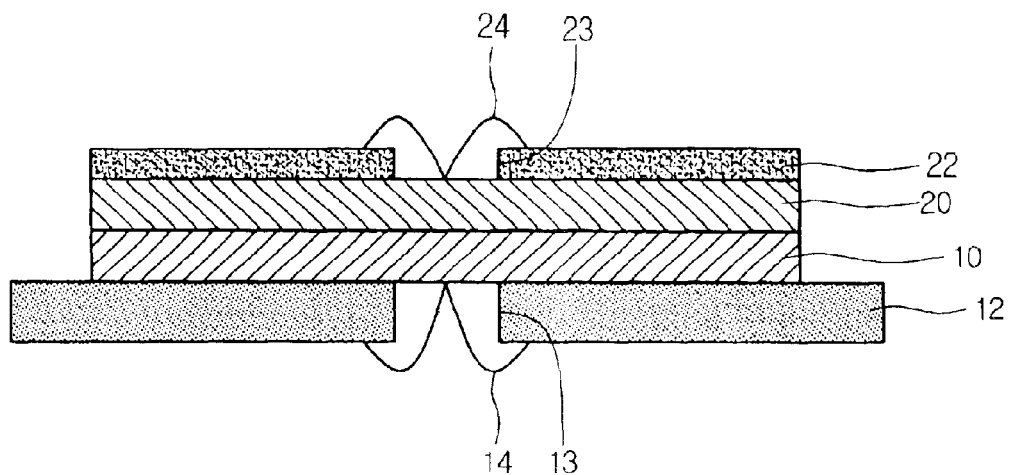

Then, as shown in FIG. 2C, the first and the second semiconductor chips are bonded. The bonding process is performed to attach the backsides (the opposite side to the side where a circuit is formed) of the first and the second semiconductor chips.

Figure 2D:
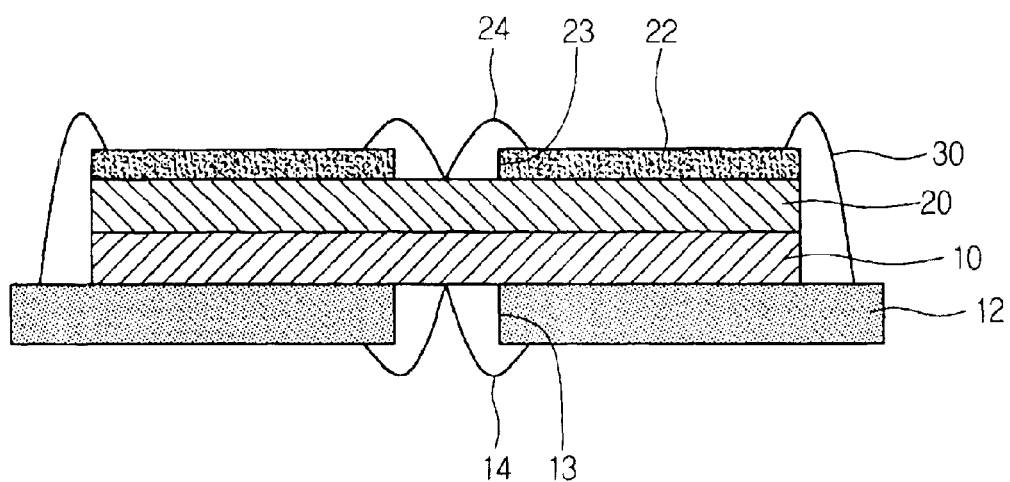

Referring to FIG. 2D, the first substrate 12 and the second substrate 22 are connected by a third bonding wire 30. The first, the second and the third bonding wires 14,24 and 30 are formed of aluminum (Al) or gold (Au).

Figure 2E:
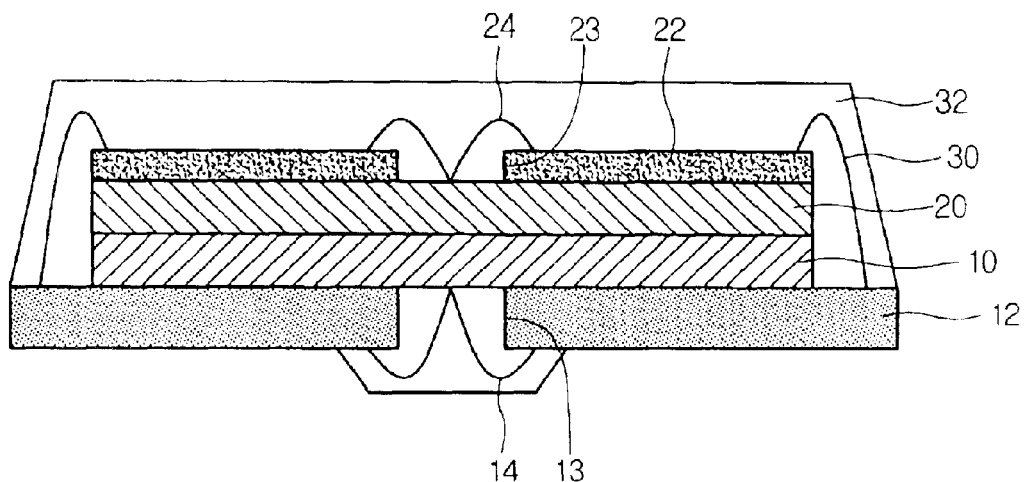

Subsequently, a molding process is performed on the resulting structure to form a molding body 32 overlaying the first, the second and the third bonding wires 14,24 and 30 as shown in FIG. 2E.

Figure 2F:
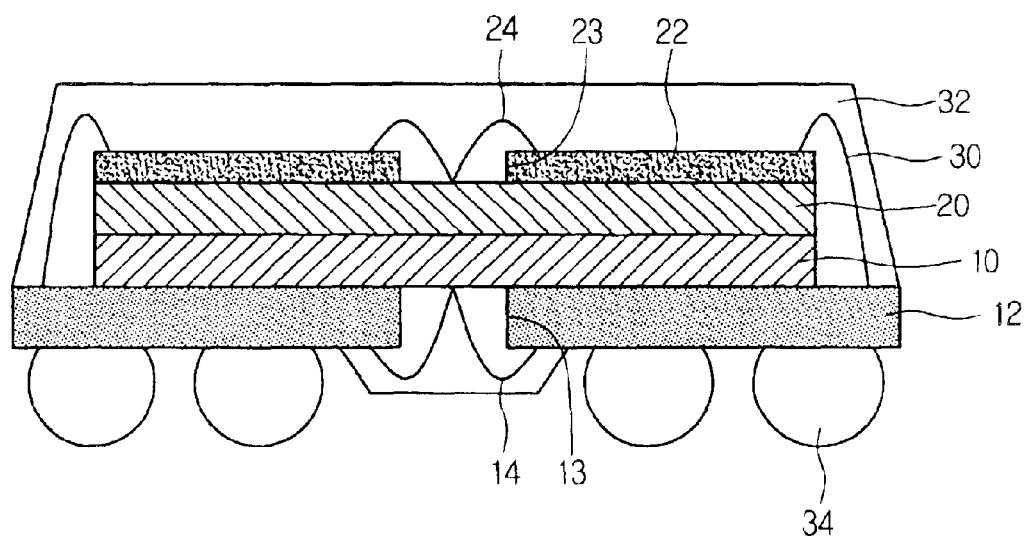

Referring to FIG. 2F, a conductive ball 34 is adhered to a ball land (not shown) on the bottom of the first substrate 12. The ball land has a diameter in the range of 150 to 700 $\mu$m. The conductive ball 34 has a diameter in the range of 100 $\mu$m to 1 mn. The conductive ball 34 is mainly formed of Sn, further comprising one material selected from a group comprising Pb, In, Bi, Au, Zn, Cu and Sb.

FIGS. 3A to 3E are drawings showing a method for manufacturing a stacked chip package according to another embodiment of the present invention.

Figure 3A:
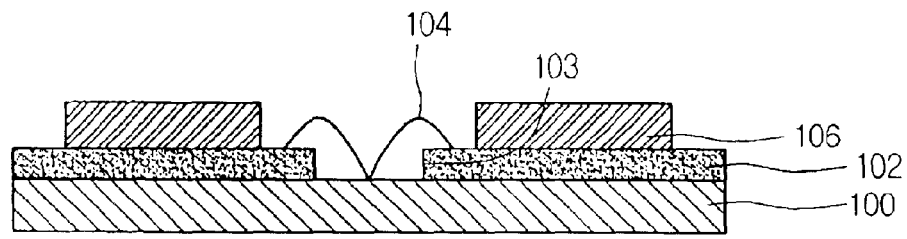
FIGS. 3A to 3E are drawings showing a method for manufacturing a stacked chip package according to another embodiment of the present invention.

Referring to FIG. 3A, a first substrate 102 including a first center window 103 is attached on a first semiconductor chip 100 having a plurality of first bonding pads (not shown) arranged on the center part by an adhesive tape (not shown).

Subsequently, a first dam 106 is attached on the first substrate 102 and a first bonding wire 104 is formed to connect the first bonding pad and the first substrate 102 using a bonding process. The first dam 106 prevents tilt and exposure of the first semiconductor chip 100 during a package molding process.

Figure 3B:
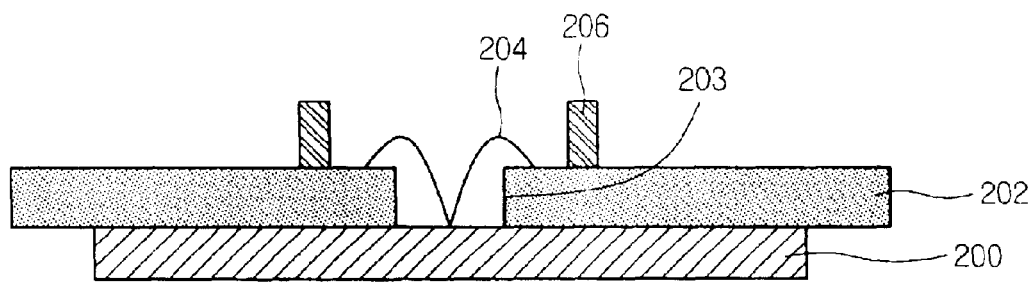

Referring to FIG. 3B, a second substrate 202 including a second center window 203 is attached on a second semiconductor chip 200 having a plurality of second bonding pads (not shown) arranged on the center part by an adhesive tape. Afterwards, a second dam 206 is attached on the second substrate 202 and then, a second bonding wire 204 is formed to connect the second bonding pad and the second substrate 202 using a bonding process. The second dam 206 prevents the generation of mold flesh on the second semiconductor chip 200 during the following molding process. The first and the second dams 106 and 206 are formed of solder resist or insulating material to a thickness of 20 .mu.m to 1 mm and they prevent undesirable flow of molding compounds during the following process.

Figure 3C:
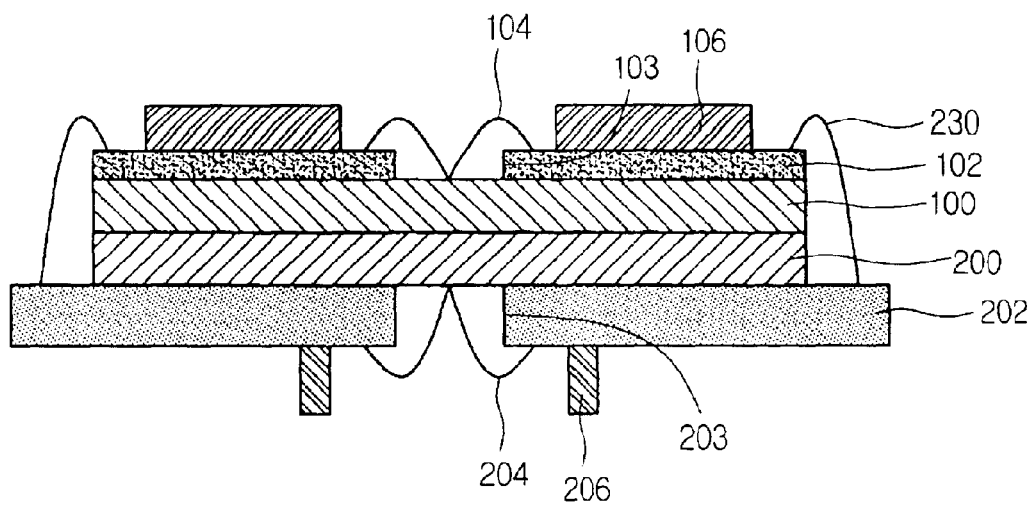

After the bonding process, the backsides of first and the second semiconductor chips 100 and 200 are attached and then, a third bonding wire 230 is formed using a bonding process to connect the second substrate 202 and the first substrate 102, as shown in FIG. 3C.

Figure 3D:
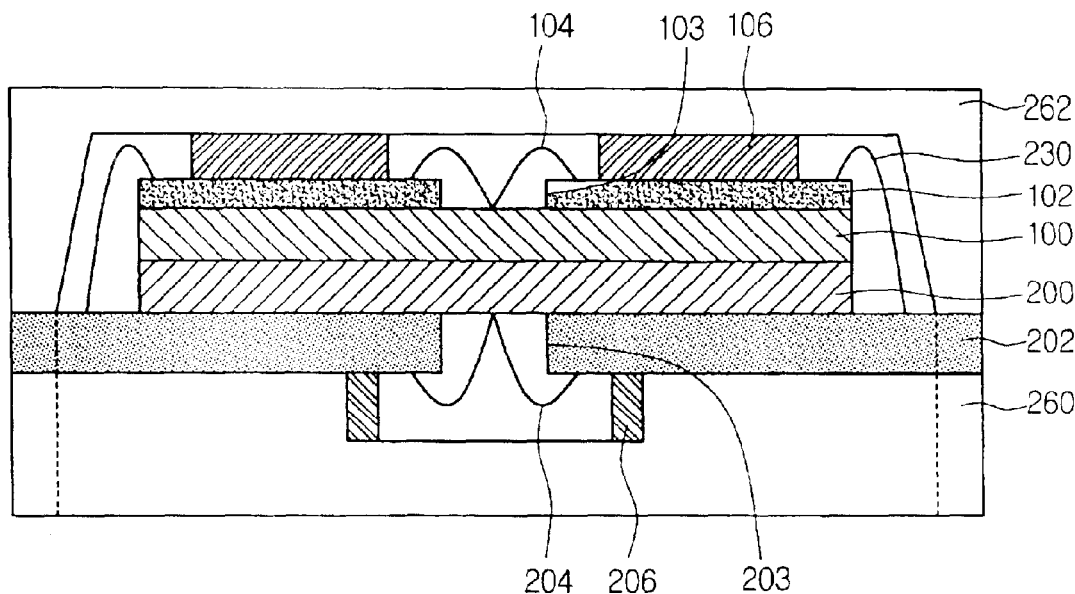
Figure 3E:
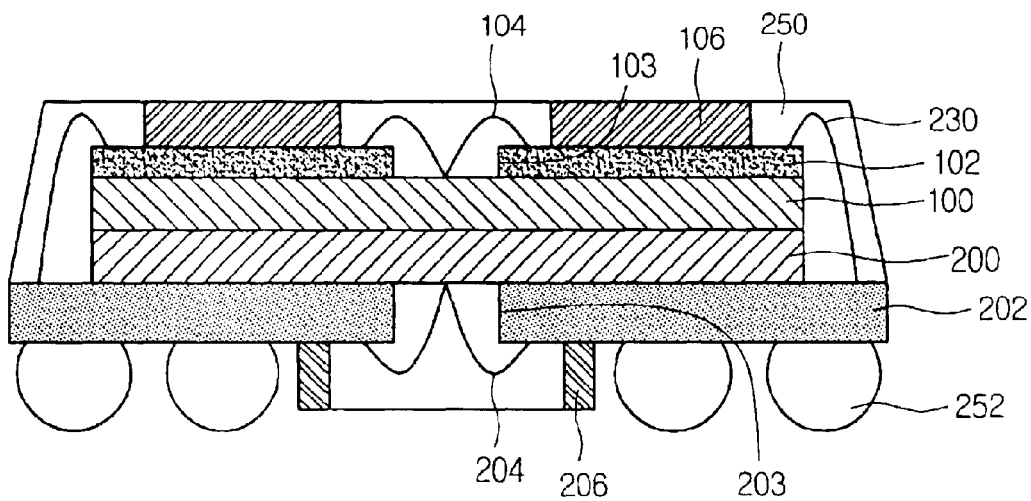

Referring to FIGS. 3D–3E, a molding process is performed on the resulting structure to form a molding body 250 overlaying the first and the second semiconductor chips 100 and 200 and the first, the second and the third bonding wires 104, 204 and 230. In this case, the first and the second dams 106 and 206 are in contact with the surface of upper and lower mold dies 262 and 260, thereby preventing tilt and exposure of first and second semiconductor chips 100 and 200 due to undesirable mold flow in a face up direction and the generation of mold flash in a face down direction.

The gap of the lower molding die 260 and the second dam 202 is considerably small and the adhesive tape is adhered in a second semiconductor chip direction as a bumper. Therefore, the second semiconductor chip is free from damage and the generation of mold flash is prevented.

Then, a conductive ball 252 is adhered on a ball land (not shown) of second substrate. The ball land has a diameter in the range of 150 to 700 $\mu$m and the conductive ball 252 has a diameter in the range of 100 $\mu$m to 1 mm. The conductive ball 252 is mainly formed of Sn, further comprising one material selected from a group comprising Pb, In, Bi, Au, Zn, Cu and Sb.

According to the first and second embodiments of the present invention, a plurality of bonding pads are arranged on the center part and the first and the second semiconductor chips having the same size are attached to perform a bonding wire process and a molding process.

As described above, it is possible to increase memory density in a restricted area by forming bonding pads on the center part and stacking a plurality of semiconductor chips having the same size.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for manufacturing a stacked chip package comprising the steps of:

attaching a first substrate having a first center window on a first semiconductor chip having a first backside and a first front side having first bonding pads arranged on the center part, wherein the first bonding pads substantially corresponds with the first center window;

forming a first bonding wires connecting the first bonding pads of the first semiconductor chip and the first substrate;

attaching a second substrate having a second center window on a second semiconductor chip having a second backside and a second front side having second bonding pads arranged on the center part, wherein the second bonding pads substantially corresponds with the second center window;

forming a second bonding wires connecting the second bonding pads of the second semiconductor chip and the second substrate;

attaching the first backside directly on the second backside;

forming a third bonding wire connecting the first and the second substrates;

forming a molding body overlaying the first, the second and the third bonding wires; and adhering a conductive ball to the first substrate.

2. The method as set forth in claim 1, further comprising the step of forming a first dam on the first substrate prior to forming the molding body, wherein the first dam prevents tilt and exposure of the first semiconductor chip during the step of forming the molding body.

3. The method as set forth in claim 2, further comprising the step of forming a second dam on the second substrate prior to forming the molding body, wherein the second dam prevents generation of mold flash on the second semiconductor chip during the step of forming the molding body.

4. The method as set forth in claim 3, wherein the first and the second dams made from a solder resist material.

5. The method as set forth in claim 3, wherein the first and the second dams have a thickness 20 $\mu$m to 1 mm.

* * * * *